(12) United States Patent
Bechevet et al.

(10) Patent No.: US 7,279,418 B2
(45) Date of Patent: Oct. 9, 2007

(54) PLASTICALLY DEFORMABLE IRREVERSIBLE STORAGE MEDIUM AND METHOD OF PRODUCING ONE SUCH MEDIUM

(75) Inventors: Bernard Bechevet, Claix (FR); Pierre Gaud, Coublevie (FR); Veronique Sousa, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/579,623

(22) PCT Filed: Dec. 2, 2004

(86) PCT No.: PCT/FR2004/003091

§ 371 (c)(1),
(2), (4) Date: May 17, 2006

(87) PCT Pub. No.: WO2005/067050

PCT Pub. Date: Jul. 21, 2005

(65) Prior Publication Data

US 2007/0072384 A1 Mar. 29, 2007

(30) Foreign Application Priority Data

Dec. 12, 2003 (FR) .................................. 03 14625

(51) Int. Cl.
*H01L 21/44* (2006.01)
(52) U.S. Cl. ................ 438/666; 257/390; 257/E21.667
(58) Field of Classification Search ................ 365/100, 365/148; 438/666, 669; 257/537, E27.006, 257/E21.667, 390
See application file for complete search history.

(56) References Cited

U.S. PATENT DOCUMENTS

| 4,396,998 | A | 8/1983 | Hunt et al. |
| 5,464,989 | A | 11/1995 | Mori et al. |
| 5,580,809 | A | 12/1996 | Mori et al. |
| 6,055,180 | A | 4/2000 | Gudesen et al. |
| 6,121,688 | A | 9/2000 | Akagawa |
| 6,351,406 | B1 | 2/2002 | Johnson et al. |
| 2002/0036927 | A1* | 3/2002 | Mori et al. ............ 365/185.33 |

FOREIGN PATENT DOCUMENTS

| EP | 0 734 065 A2 | 9/1996 |
| EP | 0 768 808 A1 | 7/1997 |

* cited by examiner

*Primary Examiner*—Matthew Smith
*Assistant Examiner*—Ankush Singal
(74) *Attorney, Agent, or Firm*—Oliff & Berridge, PLC

(57) ABSTRACT

The storage medium comprises an array of memory cells (3) which can be addressed by first (1) and second (2) conductors. Each memory cell (3) comprises one zone (10) of an active layer (8) which is initially electrically insulating and which can be made electrically conductive by means of localized plastic deformation (4), such as to selectively connect the first (1) and second (2) associated conductors. Binary information stored in the memory cell (3) is determined by the electrical conducting state of the corresponding zone (10) of the active layer (8). The active layer (8) can be formed using a charged resin. The medium production method comprises assembly of a blank storage medium having an active layer (8) which is in the initial insulating state, production of a stamping die having a stamping pattern that corresponds to the information to be stored, and stamping of the storage medium using the stamping die.

7 Claims, 3 Drawing Sheets

PLASTICALLY DEFORMABLE IRREVERSIBLE STORAGE MEDIUM AND METHOD OF PRODUCING ONE SUCH MEDIUM

BACKGROUND OF THE INVENTION

The invention relates to a method for producing an irreversible storage medium comprising an array of memory cells, each memory cell comprising one zone of an active layer arranged between first and second conductors, binary information stored in the memory cell being determined by the electrical conducting state of the corresponding zone.

STATE OF THE ART

Silicon-based solid memories, for example flash memories, are well known and widely used at the present time.

Conventionally, a solid memory comprises a matrix array of superposed perpendicular conductors insulated from one another, that are successively addressed by multiplexing. Memory cells are arranged at the intersections of the conductors. To produce a read-only memory (ROM), the information of a file to be stored are for example recorded in the material constituting the memory cells by means of a specific lithography mask. The corresponding lithography and masking steps represent a considerable proportion of the costs of such a memory.

The U.S. Pat. No. 6,351,406 describes a programmable irreversible storage medium comprising an array of memory cells. Each memory cell can be addressed by a first and a second conductor and comprises a state change element connected between the first and second conductors. Melting of an insulating thin film arranged between two electrodes and formation of a permanent conducting connection between the two electrodes can be achieved by using a strong current for example. In this way, all the memory cells of the storage medium can be programmed. However, bulk fabrication techniques of these irreversible storage media are not reliable and present high costs.

Other types of irreversible storage media, for example pre-recorded read-only memories, require additional masking steps when fabrication is performed, which makes fabrication thereof costly.

The document U.S. Pat. No. 6,055,180 describes a storage medium comprising an array of memory cells, able to be addressed by first and second conductors respectively arranged on each side of an active medium. The active medium comprises at least one organic material and presents different chemical or physical states corresponding to logic values that can be detected by electrical means. Each memory cell comprises a zone of the active medium forming an electrical connection between the corresponding first and second conductors. Data can be written on a memory cell by Joule effect by applying a strong current flowing through the corresponding zone of the medium. Judiciously choosing the active medium material enables the impedance of the cell to be changed in reversible or irreversible manner.

The document U.S. Pat. No. 6,121,688 describes an anisotropic conducting foil designed to be integrated in a printed circuit. The conducting foil comprises a resin and conducting particles, for example made of metal, inserted in the resin. The foil is arranged between an aluminium conductor and a conducting track of a printed circuit. The conducting track is deformed so as to compress the conducting foil between the conducting track and the conductor. The compressed zone of the conducting foil forms a conducting electrical connection between the conducting track and the conductor.

OBJECT OF THE INVENTION

It is an object of the invention to remedy these shortcomings and, in particular, to propose production of an irreversible storage medium inexpensively while using reliable fabrication techniques.

According to the invention, this object is achieved by the appended claims and, in particular, by the fact that the method for producing the storage medium comprises assembly of a blank storage medium having an active layer which is in an initial insulating state, production of a stamping die having a stamping pattern that corresponds to the information to be stored, and stamping of the storage medium using the stamping die so as to make predetermined zones of the layer active electrically conductive by means of localised plastic deformation.

It is a further object of the invention to provide an irreversible storage medium obtained by means of the method according to the invention.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
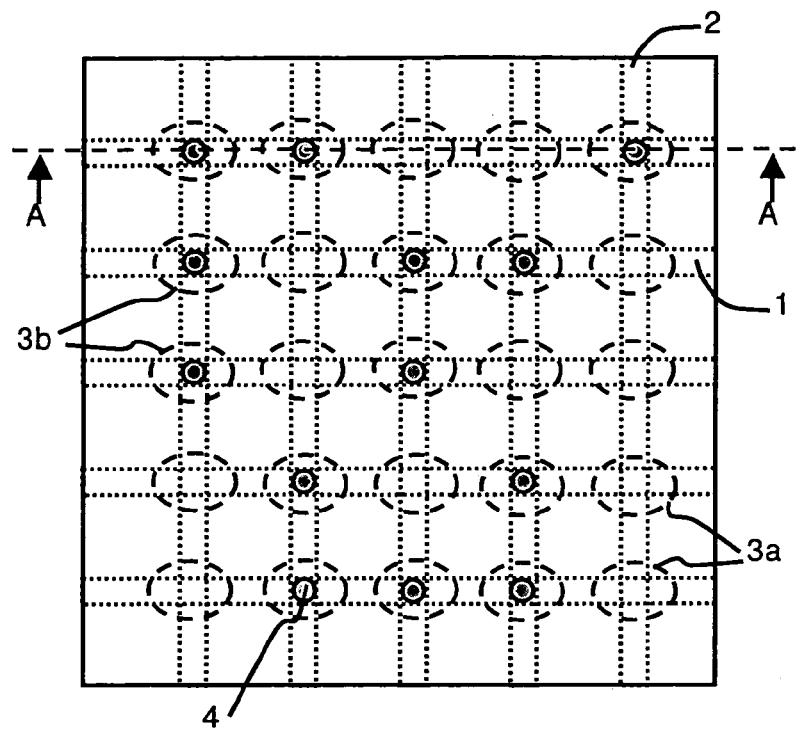
FIGS. 1 and 2 illustrate a particular embodiment of a storage medium according to the invention, respectively in top view and in cross-section along the line A-A.

In FIG. 1, an irreversible storage medium comprises five first conductors 1, represented horizontally in broken lines, and five second conductors 2, represented vertically in broken lines. The conductors 1 and 2 are insulated from one another. Twenty-five memory cells 3 are arranged in an array, respectively at the intersections of the first 1 and second 2 conductors, and can be addressed by the associated first 1 and second 2 conductors. First memory cells 3a are in their initial, which is insulating, whereas second memory cells 3b have undergone localised plastic deformations 4 so as to modify their conducting state. Thus, information is defined either by a memory cell 3a when it corresponds to a first binary level (for example 0), or by a memory cell 3b when it corresponds to a second binary level (for example 1).

Figure 2:
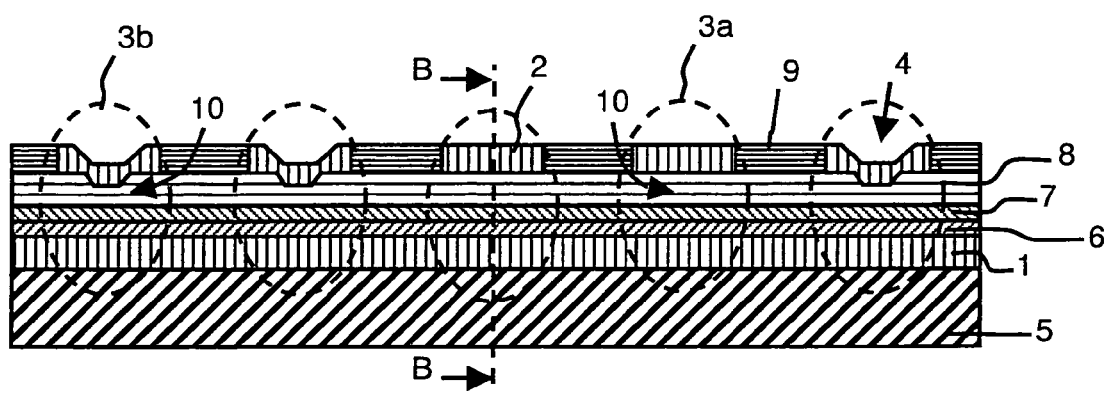
Figure 3:
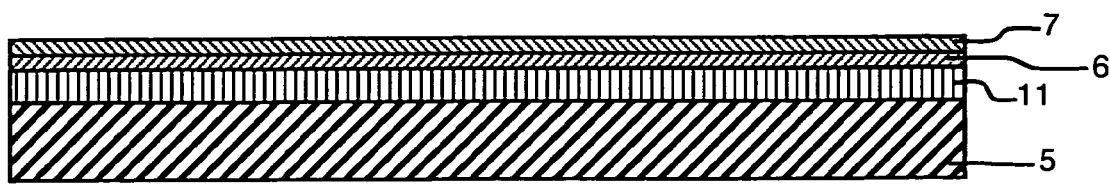
FIGS. 3 to 5, on the one hand, and FIG. 6, on the other hand, represent the different steps of a particular embodiment of a method of assembly of a storage medium according to FIG. 2, in cross-section respectively along the line B-B of FIG. 2 and along the line A-A of FIG. 1.

In FIG. 2, the irreversible storage medium according to FIG. 1 is represented in cross-section along the line A-A. A first conductor 1 is arranged on a substrate 5, for example made of silicon. On the first conductor 1, a stack of a first doped semi-conducting layer 6 and a second, oppositely doped, semi-conducting layer 7 forms a diode associated with the first conductor 1 represented. An active layer 8 is arranged on the semi-conducting layers 6 and 7. The second conductors 2 are arranged on the active layer 8 and the space between the second conductors 2 is filled, for example with a technique using a planarization resin 9 and/or using a mechanical-chemical polishing step, so as to create a common plane with the second conductors 2. The active layer 8 is initially electrically insulating and can be made electrically conductive by plastic deformation 4. Each memory cell 3 comprises an active layer zone 10 between the associated first 1 and second 2 conductors. The active layer zones 10 of the first memory cells 3a are in their insulating initial state, whereas the active layer zones 10 of the second memory cells 3b are selectively made electrically conducting by localised plastic deformation 4. Thus, the binary information stored in each memory cell 3 is determined by the electrical conduction state of the corresponding zone 10 of the layer active 8.

Preferably, the active layer 8 is formed by an initially insulating charged resin, for example charged with ions or conducting particles, which becomes conductive when it is compressed.

In FIG. 2, each memory cell 3 thus comprises a diode formed by the stack of semi-conducting layers 7 and 8, connected in series with the corresponding zone 10 of the active layer 8 between the associated first 1 and second 2 conductors. However, any non-linear electronic element can replace the diode.

In the particular embodiment represented in FIGS. 1 and 2, the first 1 and second 2 conductors respectively form a first array of parallel conductors arranged in a first plane, the lower plane in FIG. 2, and a second array of parallel conductors arranged in a second plane, the upper plane in FIG. 2, and perpendicular to the first conductors 1. In a general manner, however, the conductors can be arranged in any array form.

The method for producing the irreversible storage medium comprises assembly of a blank storage medium having an active layer 8 in an insulating initial state, production of a stamping die having a stamping pattern corresponding to the information to be stored and stamping of the storage medium by means of the stamping die.

FIGS. 3 to 6 illustrate assembly of a blank storage medium. In a first assembly step represented in FIG. 3, a first conducting layer 11 and two oppositely dosed semi-conducting layers 6 and 7 are successively deposited on the substrate 5. The first conducting layer 11 is for example made of copper or aluminium.

Figure 4:
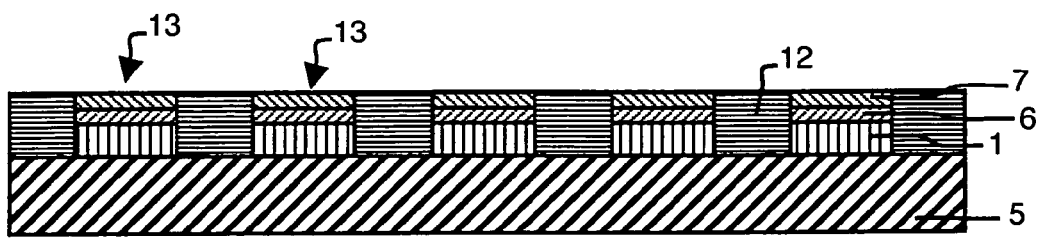

A second step, of etching of the layers 11, 6 and 7, and a third step, of depositing a planarization resin 12, are represented in FIG. 4. Filling of the space between the strips 13 of the first array of parallel strips 13 can comprise a mechanical-chemical polishing step. Etching of the stack formed by the first conducting layer 11 and the two semi-conducting layers 6 and 7 is performed such as to delineate a first array of parallel strips 13. The etched first conducting layers 11 of the strips 13 thus obtained form the first conductors 1. Deposition of the planarization resin 12 enables the space between the strips 13 of the first array of parallel strips 13 to be filled, so that the planarization resin 12 creates a common plane with the strips 13 of the first array of parallel strips 13.

Figure 5:
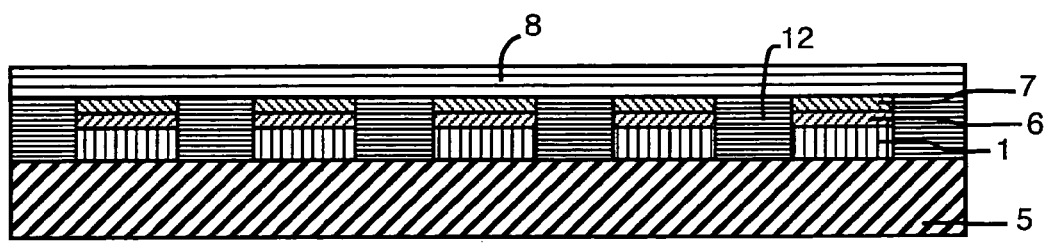

Then, in a fourth step, represented in FIG. 5, the active layer 8 is deposited on said common plane.

Figure 6:
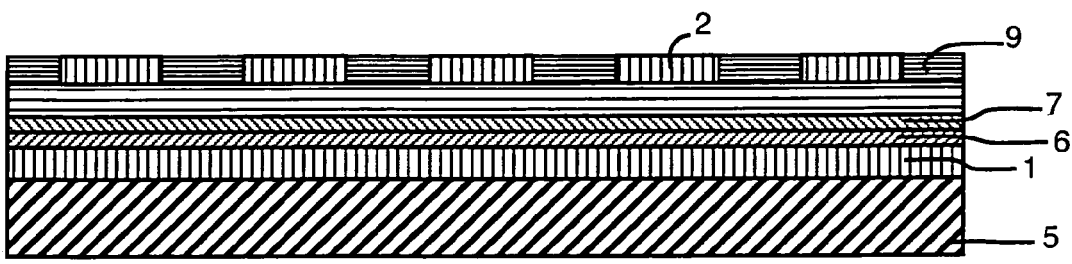

A second conducting layer is deposited on the active layer 8 in a fifth step and is then etched in a sixth step so as to form a second array of parallel strips perpendicular to the strips of the first array of strips. The strips thus obtained form the second conductors 2 (FIG. 6). In a seventh step, the space between the second conductors 2 is filled, for example, with a technique using a planarization resin 9 or using a mechanical-chemical polishing step.

Figure 7:
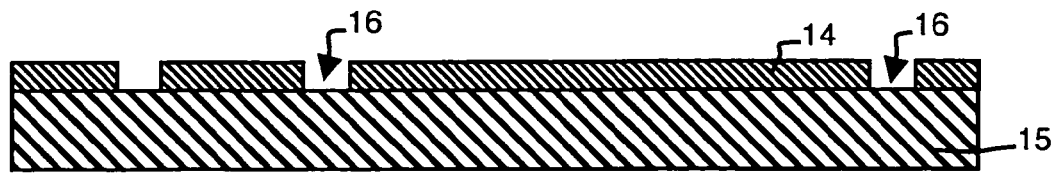
FIGS. 7 and 8 represent a particular embodiment of fabrication of a stamping die.
Figure 8:
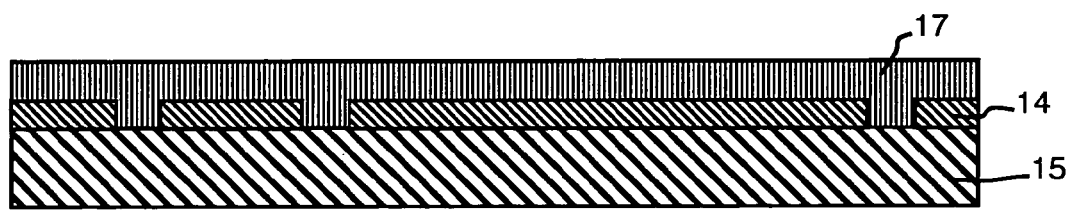

FIGS. 7 and 8 illustrate production of a stamping die designed to irreversibly store a piece of information in a blank storage medium. In FIG. 7, a photoresist 14 is deposited on an intermediate substrate 15. Then an array of elementary zones 16 having a configuration corresponding to the required stamping pattern is etched in the photoresist 14. As represented in FIG. 8, a metal forming the stamping die 17 is deposited so as to fill the elementary zones 16, by electrolytic deposition, on the intermediate substrate 15 and on the photoresist 14, which is for example previously coated with a thin conducting layer by means of a physical vapor deposition technique. Then the stamping die 17 is detached from the intermediate substrate 15 and residues of photoresist 14 are removed from the de la stamping die 17. A stamping die 17 is thus obtained comprising salient elements 18 having a configuration corresponding to the stamping pattern (FIG. 9) representative of the information to be stored.

Figure 9:
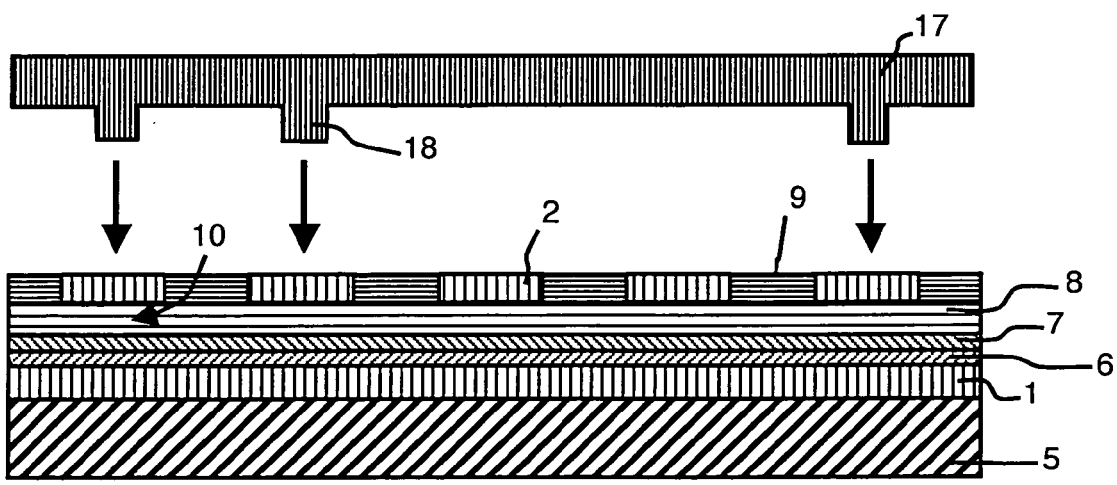
FIG. 9 represents a particular embodiment of die stamping of the storage medium according to FIG. 6 by means of the stamping die according to FIGS. 7 and 8.

For stamping of the storage medium, as represented in FIG. 9, the storage medium and stamping die 17 are aligned and a pressure is exerted on the stamping die 17 such that the salient elements 18 of the stamping die 17 deform the zones 10 of the layer active 8 arranged facing the salient elements 18, through the second conductor 2.

The layer active 8 can also be a thin insulating layer, the stamping deforming the second conductor 2 so as to establish a direct mechanical contact between the material of the second conductor 2 and the associated underlying diode, totally crushing the insulating layer at the location of the memory cell involved.

Several irreversible storage media can therefore be assembled collectively by means of a single process, regardless of the information to be stored and without specific lithography steps of the information to be stored. Producing a series of media designed to store the same information requires fabrication of a single specific stamping die. Stamping of a series of small or large media is less complex and can be performed at lower cost than performing additional lithography steps for each medium or programming of each of the programmable irreversible storage media.

The invention claimed is:

1. A method for producing an irreversible storage medium including an array of memory cells, each memory cell including one zone of an active layer arranged between first and second conductors, binary information stored in each memory cell being determined by the electrical conducting state of a corresponding zone, the method comprising:
   assembling a blank storage medium having the active layer, which is in an initial insulating state;
   producing a stamping die having a stamping pattern that corresponds to the binary information to be stored; and
   stamping the storage medium using the stamping die so as to make predetermined zones of the active layer electrically conductive by means of localised plastic deformation.

2. The method according to claim 1, wherein the active layer is formed by a charged resin.

3. The method according to claim 1, wherein the assembling the blank storage medium successively includes:
   depositing on a substrate, a first conducting layer and two oppositely doped semi-conducting layers;
   etching a stack formed by the first conducting layer and the two semi-conducting layers so as to obtain a first array of parallel strips;

filling a space between the strips of the first array of parallel strips so as to create a common plane with the strips of the first array of parallel strips;

depositing the active layer on the common plane;

depositing a second conducting layer on the active layer;

etching the second conducting layer so as to obtain a second array of parallel strips perpendicular to the strips of the first array of strips; and filling the space between the strips of the second array of parallel strips.

4. The method according to claim 3, wherein the space between the strips of the first and/or second array of parallel strips is filled by means of a technique using a planarization resin.

5. The method according to claim 3, wherein the space between the strips of the first and/or second array of parallel strips is filled by means of a mechanical-chemical polishing step.

6. The method according to claim 1, wherein the producing the stamping die successively includes:

depositing a photoresist on an intermediate substrate;

etching in the photoresist, an array of elementary zones having a configuration corresponding to the stamping pattern;

electrolytically depositing on the intermediate substrate and the photoresist a metal constituting the stamping die;

detaching the stamping die from the intermediate subtrate; and removing the residues of the photoresist from the stamping die.

7. An irreversible storage medium formed by the method according to claim 1.

* * * * *